(12) United States Patent
Howland, Jr. et al.

(10) Patent No.: US 7,026,837 B2
(45) Date of Patent: Apr. 11, 2006

(54) METHOD AND APPARATUS FOR DETERMINING THE DIELECTRIC CONSTANT OF A LOW PERMITTIVITY DIELECTRIC ON A SEMICONDUCTOR WAFER

(75) Inventors: William H. Howland, Jr., Wexford, PA (US); Christine E. Kalnas, Pittsburgh, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 0 days.

(21) Appl. No.: 10/749,031

(22) Filed: Dec. 30, 2003

(65) Prior Publication Data

US 2005/0146348 A1 Jul. 7, 2005

(51) Int. Cl.
G01R 31/26 (2006.01)
G01R 27/26 (2006.01)

(52) U.S. Cl. ..................... 324/766; 324/663
(58) Field of Classification Search ............... 324/519, 324/527, 658, 765, 766, 158.1, 662, 663, 324/671, 686, 690
See application file for complete search history.

(56) References Cited

U.S. PATENT DOCUMENTS

| 4,236,109 A | 11/1980 | Ingle, Jr. | |
|---|---|---|---|
| 5,309,110 A | 5/1994 | O'Neill et al. | |
| 5,528,153 A * | 6/1996 | Taylor et al. | 324/671 |
| 6,037,781 A * | 3/2000 | Kono et al. | 324/537 |
| 6,172,506 B1 | 1/2001 | Adderton et al. | |
| 6,220,080 B1 * | 4/2001 | Fauque | 324/662 |
| 6,507,197 B1 | 1/2003 | Itoh et al. | |
| 6,583,640 B1 * | 6/2003 | Eriguchi et al. | 324/765 |

FOREIGN PATENT DOCUMENTS

| EP | 0 347 125 A2 | 12/1989 |
|---|---|---|
| GB | 2 106 654 A | 4/1983 |
| JP | 04 027139 A | 1/1992 |
| WO | WO 02/46782 A1 | 6/2002 |

OTHER PUBLICATIONS

O. Jeandupeux, V. Marsico, A. Acovic, P. Fazan, H. Brune and K.Kern; "Use of Scanning Capacitance Microscopy For Controlling Water Processing"; Microelectroncis Realiability 42; pp 225-231; (2002), month unavailable.

* cited by examiner

Primary Examiner—Vinh Nguyen
Assistant Examiner—Russell M. Kobert
(74) Attorney, Agent, or Firm—The Webb Law Firm

(57) ABSTRACT

In an apparatus and method for determining a permittivity of a dielectric layer on a semiconductor wafer, a thickness of the dielectric layer is determined and a topside of the wafer is moved into contact with a spherical portion of an at least partially spherical and electrically conductive surface. An electrical stimulus is applied between the electrically conductive surface and the semiconducting material. A capacitance of a capacitor comprised of the electrically conductive surface, the semiconductor material and the dielectric layer is determined from the applied stimulus. A permittivity of the dielectric layer is then determined as a function of the capacitance and the thickness of the dielectric layer.

15 Claims, 4 Drawing Sheets

METHOD AND APPARATUS FOR DETERMINING THE DIELECTRIC CONSTANT OF A LOW PERMITTIVITY DIELECTRIC ON A SEMICONDUCTOR WAFER

BACKGROUND OF THE INVENTION

1. Field of the Invention

The present invention relates to semiconductor wafer testing.

2. Description of Related Art

In multi-level metallizations in integrated circuits, an interlayer dielectric (ILD) electrically isolates adjacent metal layers. The permittivity ($\in$) or dielectric constant (k) of the ILD is, therefore, an increasingly critical parameter as device dimensions shrink. By way of background, the permittivity ($\in$) of a material is equal to the product of the material's dielectric constant (k) times the permittivity ($\in_0$) of free space, i.e., $\in = (k)(\in_0)$.

Second generation low permittivity, or low-k, dielectric materials, synthesized by chemical vapor deposition or spin-casting techniques, are currently being developed. These low permittivity dielectrics include both inorganic (silicon-based) and organic (carbon-based) materials, often with controlled levels of porosity. The use of a dielectric layer having a lower permittivity than previous generations of semiconductor devices reduces RC time delays, prevents cross talk and reduces power consumption in devices by decreasing the parasitic capacitance of the ILD layer.

Capacitance-voltage (CV) measurements on dielectric materials to determine permittivity are often made with mercury probes. There are several disadvantages with utilizing mercury probes. First, a minimum thickness of dielectric material is required for measuring materials with high permittivities. Second, new low permittivity materials (dielectric constants<3.9 ($SiO_2$)) are often porous, whereupon the mercury contact area is affected. Third, new requirements for semiconductor fabrication facilities increasingly ban the use of mercury.

Similar to CV measurements, charge-voltage measurements on dielectric materials to determine the permittivity thereof have been recently made utilizing corona-based methods. These methods are based on a deposition of charge onto the dielectric surface with a subsequent surface voltage measurement. Disadvantages of the corona-based method include the time needed to make each measurement, the large measurement spot size, and poor likelihood that end users will allow for corona deposition of product wafers.

CV measurements on dielectric materials utilizing conductive elastic probes have been successful for measuring high permittivity, or high-k, materials down to a thickness of less than 1.0 nm. However, the current design of these conductive elastic probes developed for high permittivity materials cannot be used for measurement of low permittivity materials. This is due to the small contact diameter, e.g., between 30 μm and 50 μm, of the conductive elastic probe in combination with a thicker, e.g., >200 μm thick, low permittivity film resulting in a weak electrical signal of only several pF. Moreover, according to Hertzian calculations, the maximum pressure the prior art conductive elastic probes can apply may cause yielding of many organic low permittivity films.

Therefore, what is needed is a method and apparatus for determining the permittivity or dielectric constant, of the thicker, low permittivity dielectric layers on semiconductor wafers.

SUMMARY OF THE INVENTION

The invention is a method of determining a permittivity of a dielectric layer of a semiconductor wafer. The method includes providing a means for contacting a topside of a semiconductor wafer. The contact means includes at least a partially spherical surface formed from a conductive material. A thickness of a dielectric layer on the semiconductor wafer having semiconducting material underlying the dielectric layer is determined. The topside of the semiconductor wafer is caused to support the at least partially spherical surface of the contact means in spaced relation to the semiconducting material thereby defining a capacitor. An electrical stimulus is applied to the contact means and the semiconducting material when the capacitor is defined. A capacitance of the capacitor is determined from the response thereof to the applied stimulus. The permittivity of the dielectric layer can then be determined as a function of the thus determined capacitance and the thickness of the dielectric layer determined above.

The topside of the semiconductor wafer includes at least one of (1) a surface of a dielectric layer opposite the semiconducting material or (2) a surface of organic(s) and/or water overlaying the surface of the dielectric layer opposite the semiconducting material.

The method can further include desorbing at least one of water and organic(s) from the surface of the dielectric layer.

The at least partially spherical surface of the contact means can be formed from a material that either does not form an oxide layer or forms a conductive oxide. The contact means can be formed entirely from a conductive material or can be formed from a conductive or insulating substrate having a conductive coating defining the at least partially spherical surface. One non-limiting example of a material from which the substrate can be formed includes glass.

The capacitance that is determined above includes the sum of (1) a capacitance where the topside of a semiconductor wafer supports the contact means in spaced relation to the semiconducting material and (2) a capacitance of a gap between the contact means and the topside of the semiconductor wafer adjacent where the topside of the semiconductor wafer supports the contact means in spaced relation to the semiconducting material.

The permittivity of the dielectric layer ($\in_{ox}$) can be determined utilizing the formula:

$$C = \varepsilon_0 A[(T_p/\varepsilon_p) + (T_{ox}/\varepsilon_{ox}) + (T_{org}/\varepsilon_{org})]^{-1} +$$

$$2\pi\varepsilon_0\varepsilon_{H_2O} R \ln\left[\frac{(T_p/\varepsilon_p) + (T_{ox}/\varepsilon_{ox}) + (T_{org}/\varepsilon_{org}) + (T_{H_2O}/\varepsilon_{H_2O})}{(T_p/\varepsilon_p) + (T_{ox}/\varepsilon_{ox}) + (T_{org}/\varepsilon_{org})}\right] +$$

$$2\pi\varepsilon_0 R \ln\left[\frac{(T_p/\varepsilon_p) + (T_{ox}/\varepsilon_{ox}) + (T_{org}/\varepsilon_{org}) + (T_{H_2O}/\varepsilon_{H_2O}) + (T_{gap})}{(T_p/\varepsilon_p) + (T_{ox}/\varepsilon_{ox}) + (T_{org}/\varepsilon_{org}) + (T_{H_2O}/\varepsilon_{H_2O})}\right]$$

where C=the capacitance determined in step (e);
$\in_0$=permittivity of free space;
A=contact area of the contact means in contact with the topside of the semiconductor wafer;
R=radius of curvature of the contact means;
ln=natural log;
$T_p$=thickness of an oxide layer (if any) on the surface of the contact means;
$\in_p$=permittivity of the oxide layer;
$T_{ox}$=thickness of the dielectric layer;
$\in_{ox}$=permittivity of the dielectric layer;

$T_{org}$=thickness of the organic(s) (if any) overlaying the dielectric layer, $\in_{org}$=permittivity of the organic(s);

$T_{H_2O}$=thickness of the water (if any) overlaying the dielectric layer;

$\in_{H_2O}$=permittivity of the water; and $T_{gap}$=thickness of a gap between the surface of the contact means and the topside of the semiconductor wafer adjacent where the topside supports the surface of the contact means in spaced relation to the semiconducting material.

The invention is also an apparatus for determining a permittivity of the dielectric layer of a semiconductor wafer. The apparatus includes means for contacting a topside of a semiconductor wafer, wherein the contact means includes an at least a partially spherical surface formed from a conductive material. The apparatus also includes means for determining a thickness of a dielectric layer on the semiconductor wafer having semiconducting material underlying the dielectric layer and means for moving the topside of the semiconductor wafer and the at least partially spherically surface of the contact means into the contact, thereby defining with the dielectric layer a capacitor. The apparatus further includes means for applying a suitable electrical stimulus, e.g., a CV stimulus, to the contact means and the semiconducting material when the capacitor is defined and means for determining from the response of the capacitor to the applied electrical stimulus a capacitance of the capacitor and for determining therefrom a permittivity of the dielectric layer as a function of the capacitance and the thickness of the dielectric layer.

Lastly, the invention is a method of determining a permittivity of a dielectric layer of a semiconductor wafer comprising: (a) determining a thickness of the dielectric layer overlaying semiconducting material of a semiconductor wafer; (b) moving a topside of the semiconductor wafer and a spherical portion of an at least a partially spherical and electrically conductive surface into contact; (c) applying an electrical stimulus between the electrically conductive surface and the semiconducting material; (d) determining from the applied electrical stimulus a capacitance of a capacitor comprised of the electrically conductive surface, the semiconducting material and the dielectric layer therebetween; and (e) determining a permittivity of the dielectric layer as a function of the capacitance determined in step (d) and the thickness of the dielectric layer determined in step (a).

DETAILED DESCRIPTION OF THE INVENTION

The present invention will be described with reference to the accompanying figures where like reference numbers correspond to like elements.

Figure 1:
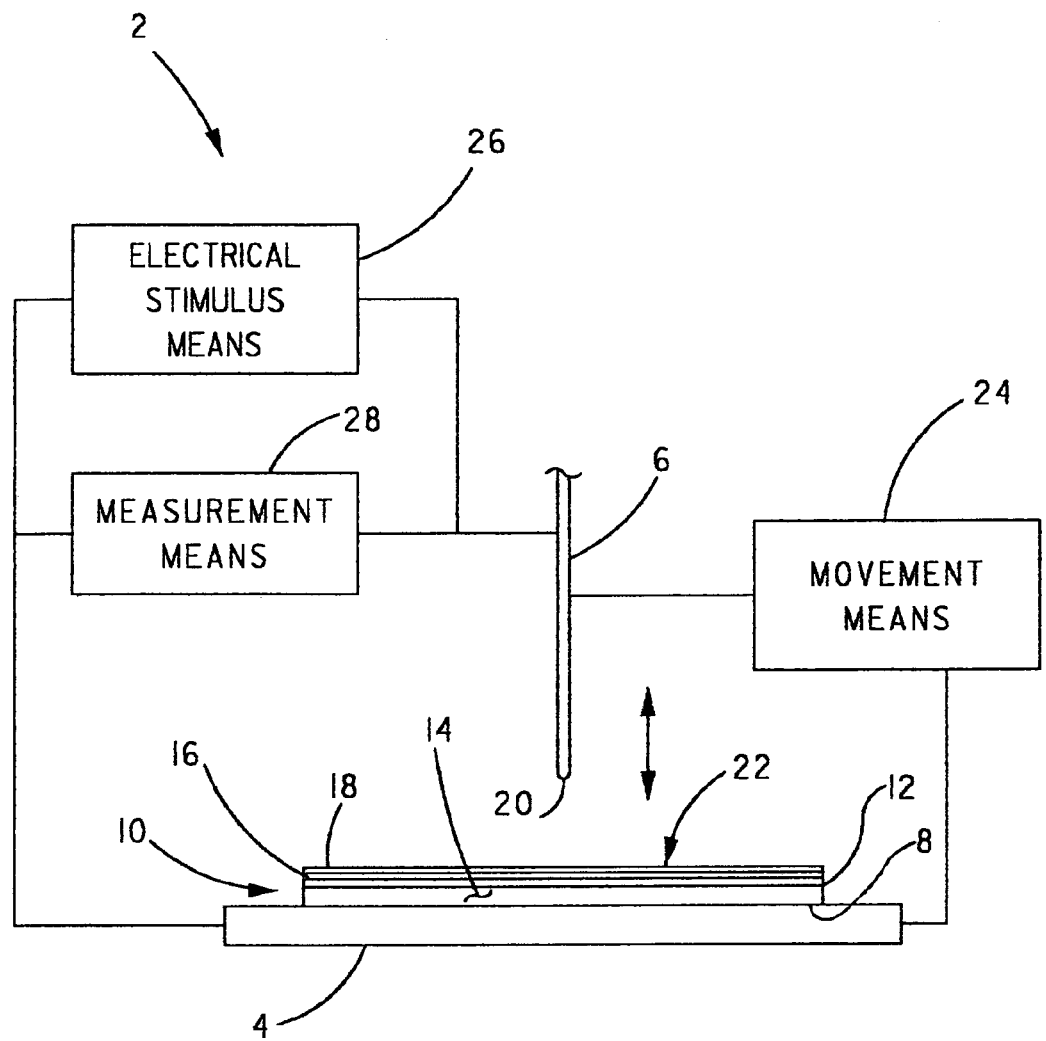
FIG. 1 is a diagrammatic view of a semiconductor wafer having a dielectric layer thereon and an apparatus for determining the permittivity of the dielectric layer.
Figure 2:
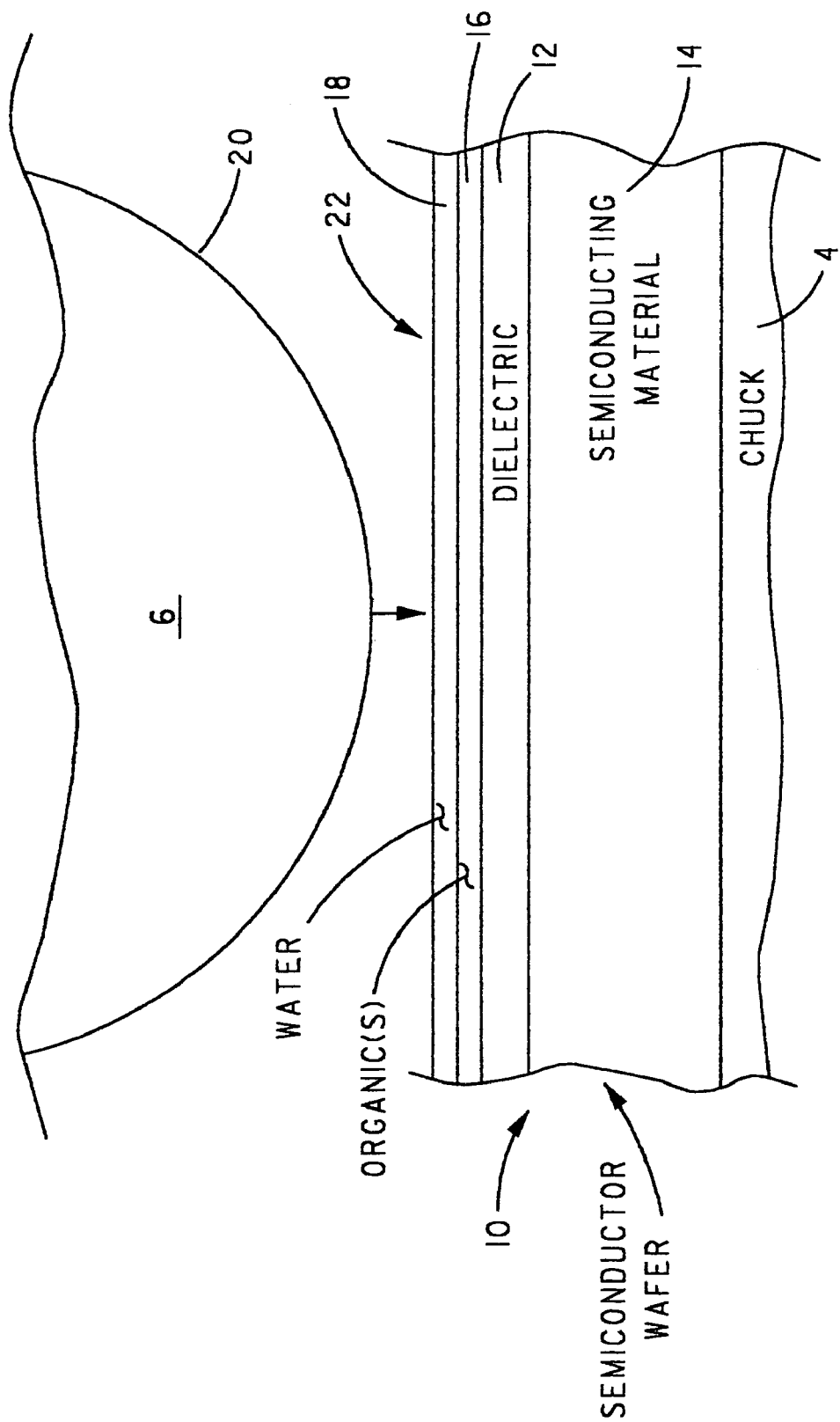
FIG. 2 is an enlarged view of the distal end of the contact means above the semiconductor wafer shown in FIG. 1.

With reference to FIGS. 1 and 2, a semiconductor wafer testing system 2 includes an electrically conductive chuck 4 and a contact means 6. Chuck 4 is configured to support a backside 8 of a semiconductor wafer 10 which has a dielectric layer 12 overlaying a semiconducting material 14 which is in contact with chuck 4. If left exposed to atmospheric conditions for sufficient time, organic(s) 16 and/or water 18 will form on dielectric layer 12.

Desirably, contact means 6 includes at least a partially spherical and conductive surface 20 for contacting a topside 22 of semiconductor wafer 10. The diameter of surface 20 is desirably $\geqq 25$ mm. While partially spherical, conductive surface 20 is desired, it is envisioned that surfaces (not shown) having other shapes can be utilized. Accordingly, the description herein of partially spherical conductive surface 20 is not to be construed as limiting the invention.

When semiconductor wafer 10 includes organic(s) 16 and/or water 18, topside 22 can be a surface of any one or combination of organic(s) 16, water 18 and dielectric layer 12, although top surface 22 will typically be the exposed surface of water 18, as shown in FIG. 2. In FIGS. 1 and 2, organic(s) 16 and water 18 are shown as separate layers, and typically this will be the case. However, this is not to be construed as limiting the invention since this order can be reversed or organic(s) 16 and water 18 can be mixed. e.g., into a dispersion, whereupon such mixture forms a single layer overlaying dielectric layer 12.

Figure 3:
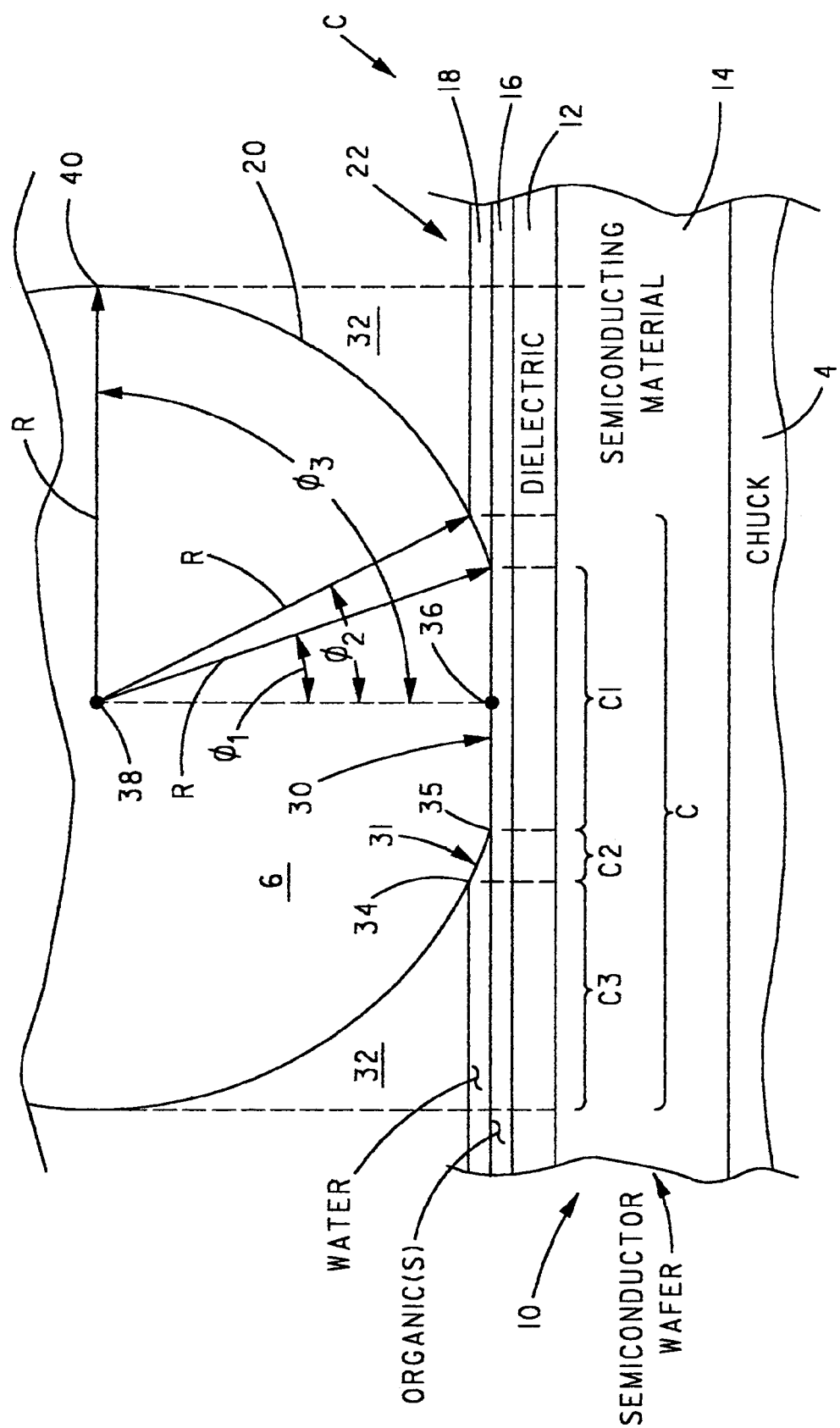
FIG. 3 is a view of the distal end of the contact means in contact with the topside of the semiconductor wafer shown in FIG. 1 where the topside includes water, organics or both on the surface of the dielectric layer.

With reference to FIG. 3 and with continuing reference to FIGS. 1 and 2, contact means 6 can be of any suitable form that supports surface 20. In FIG. 1, contact means 6 is illustrated in the form of an elongated probe having surface 20 positioned at the distal end thereof. However, this is not to be construed as limiting the invention.

A movement means 24 can be connected to chuck 4, contact means 6 or both for moving surface 20 and topside 22 of semiconductor wafer 10 into contact. An electrical stimulus means 26 can be electrically connected between chuck 4 and surface 20 for applying a suitable test stimulus to semiconductor wafer 10 when it is received on chuck 4 and surface 20 is in contact with topside 22 of semiconductor wafer 10. For the purpose of the present invention, one suitable test stimulus is an AC voltage. However, this is not to be construed as limiting the invention.

Surface 20 of contact means 6 held in spaced relation to semiconducting material 14 by topside 22 defines a capacitor C, wherein dielectric layer 12, organic(s) 16 and/or water 18 define a dielectric between contact means 6 and semiconducting material 14. More specifically, when surface 20 moves into contact with topside 22, water 18 substantially displaces around surface 20 and surface 20 elastically deforms upon contact with organic(s) 16 to form a contact area 30. A contact area 31 is also formed where surface 20 contacts water 18 adjacent contact area 30. Lastly, an air gap 32 is formed between a top surface of water 18 and the portion of surface 20 adjacent contact area 31. In response to electrical stimulus means 26 applying the test stimulus to capacitor C, a measurement means 28 can determine a capacitance $C_T$ of capacitor C.

Capacitance $C_T$ of capacitor C determined by measurement means 28 is the sum of a capacitance $C_1$ of a capacitor C1, formed by the portions of surface 20, semiconducting material 14, dielectric layer 12 and organic(s) 16 in alignment with contact area 30, plus a capacitance $C_2$ of a capacitor C2, formed by the portions of surface 20, semiconducting material 14, dielectric layer 12, organic(s) 16 and water 18 in alignment with contact area 31, plus a capacitance $C_3$ of a capacitor C3, formed by the portions of surface 20, semiconducting material 14, dielectric layer 12, and organic(s) 16 and/or water 18 in alignment with air gap 32.

When water 18 is not present and dielectric layer 12 is formed from a material, such as $SiO_2$, having a low permittivity, e.g., <3.9, and dielectric layer 12 is relatively thick, e.g., >200 nm, a majority of capacitance $C_T$ of capacitor C is derived from capacitance $C_3$ of capacitor C3. To this end, it has been theoretically determined that capacitance $C_3$ of capacitor C3 is approximately one order of magnitude greater than the sum of capacitance $C_1$ of capacitor C1 and capacitance $C_2$ of capacitor C2 when water 18 is not present. As a result, when water 18 is not present, the permittivity of dielectric layer 12 can be determined within an acceptable tolerance as a function of the measured capacitance $C_T$ of capacitor C and the theoretical capacitance $C_3$ of capacitor C3. More specifically, the permittivity of dielectric layer 12 can be determined within an acceptable tolerance from the measured capacitance $C_T$ of capacitor C from an equation, e.g., equation EQ 4 discussed hereinafter, for capacitance $C_3$ of capacitor C3 while ignoring capacitances $C_1$ and $C_2$ of capacitors C1 and C2, respectively. However, some amount of water 18 will typically be present. Accordingly, it's desirable to determine capacitance $C_T$ of capacitor C from the sum of capacitances $C_1$, $C_2$ and $C_3$ of capacitors C1, C2 and C3, respectively.

Specifically, capacitance $C_T$ of capacitor C can be expressed mathematically by the following equation EQ1:

$$C_T = C_1 + C_2 + C_3 \qquad \text{EQ1}$$

where $C_T$ = capacitance of capacitor C;

$C_1$ = capacitance of capacitor C1 = the capacitance resulting from the materials in alignment with contact area 30;

$C_2$ = capacitance of capacitor C2 = the capacitance resulting from the materials in alignment with contact area 31; and $C_3$ capacitance of capacitor C3 = capacitance resulting from the materials in alignment with gap 32.

Capacitances $C_1$, $C_2$ and $C_3$ of capacitors C1, C2 and C3 can be expressed mathematically by the following equations EQ2, EQ3 and EQ4, respectively:

$$\text{EQ2:} \quad C_1 = \varepsilon_0 A [(T_p/\varepsilon_p) + (T_{ox}/\varepsilon_{ox}) + (T_{org}/\varepsilon_{org})]^{-1}$$

$$\text{EQ3:} \quad C_2 = 2\pi\varepsilon_0 \varepsilon_{H_2O} R \ln\left[\frac{(T_p/\varepsilon_p) + (T_{ox}/\varepsilon_{ox}) + (T_{org}/\varepsilon_{org}) + (T_{H_2O}/\varepsilon_{H_2O})}{(T_p/\varepsilon_p) + (T_{ox}/\varepsilon_{ox}) + (T_{org}/\varepsilon_{org})}\right]$$

$$\text{EQ4:} \quad C_3 = 2\pi\varepsilon_0 \varepsilon_{H_2O} R \ln\left[\frac{(T_p/\varepsilon_p) + (T_{ox}/\varepsilon_{ox}) + (T_{org}/\varepsilon_{org}) + (T_{H_2O}/\varepsilon_{H_2O}) + (T_{gap})}{(T_p/\varepsilon_p) + (T_{ox}/\varepsilon_{ox}) + (T_{org}/\varepsilon_{org}) + (T_{H_2O}/\varepsilon_{H_2O})}\right]$$

where $\varepsilon_0$ = permittivity of free space;

A = contact area 30;

R = radius of curvature of surface 20;

ln = natural log;

$T_p$ = thickness of oxide layer (if any) on surface 20;

$\varepsilon_p$ = permittivity of oxide layer on surface 20;

$T_{ox}$ = thickness of dielectric layer 12;

$\varepsilon_{ox}$ = permittivity of dielectric layer 12;

$T_{org}$ = thickness of organic(s) 16 (if any);

$\varepsilon_{org}$ = permittivity of organic(s) 16;

$T_{H_2O}$ = thickness of water 18 (if any);

$\varepsilon_{H_2O}$ = permittivity of water 18; and $T_{gap}$ = thickness of gap 32.

As can be seen in equation EQ4, the thickness of gap 32 ($T_{gap}$) is the only variable that is not divided by a permittivity. This is because the permittivity of the air in gap 32 is one (1). Hence, in equation EQ4, $T_{gap}$ will dominate the thickness of the other materials divided by their permittivities. Similarly, when summing equations EQ2, EQ3 and EQ4 to determine the capacitance $C_T$ of capacitor C, $T_{gap}$ will typically be the primary contributor to capacitance $C_T$.

Substituting equations EQ2, EQ3 and EQ4 for $C_1$, $C_2$ and $C_3$, respectively, in equation 1, the capacitance $C_T$ of capacitor C can be determined by solving the sum of equations EQ2, EQ3 and EQ4 simultaneously in an iterative manner utilizing one or more well known numerical techniques.

Figure 4:
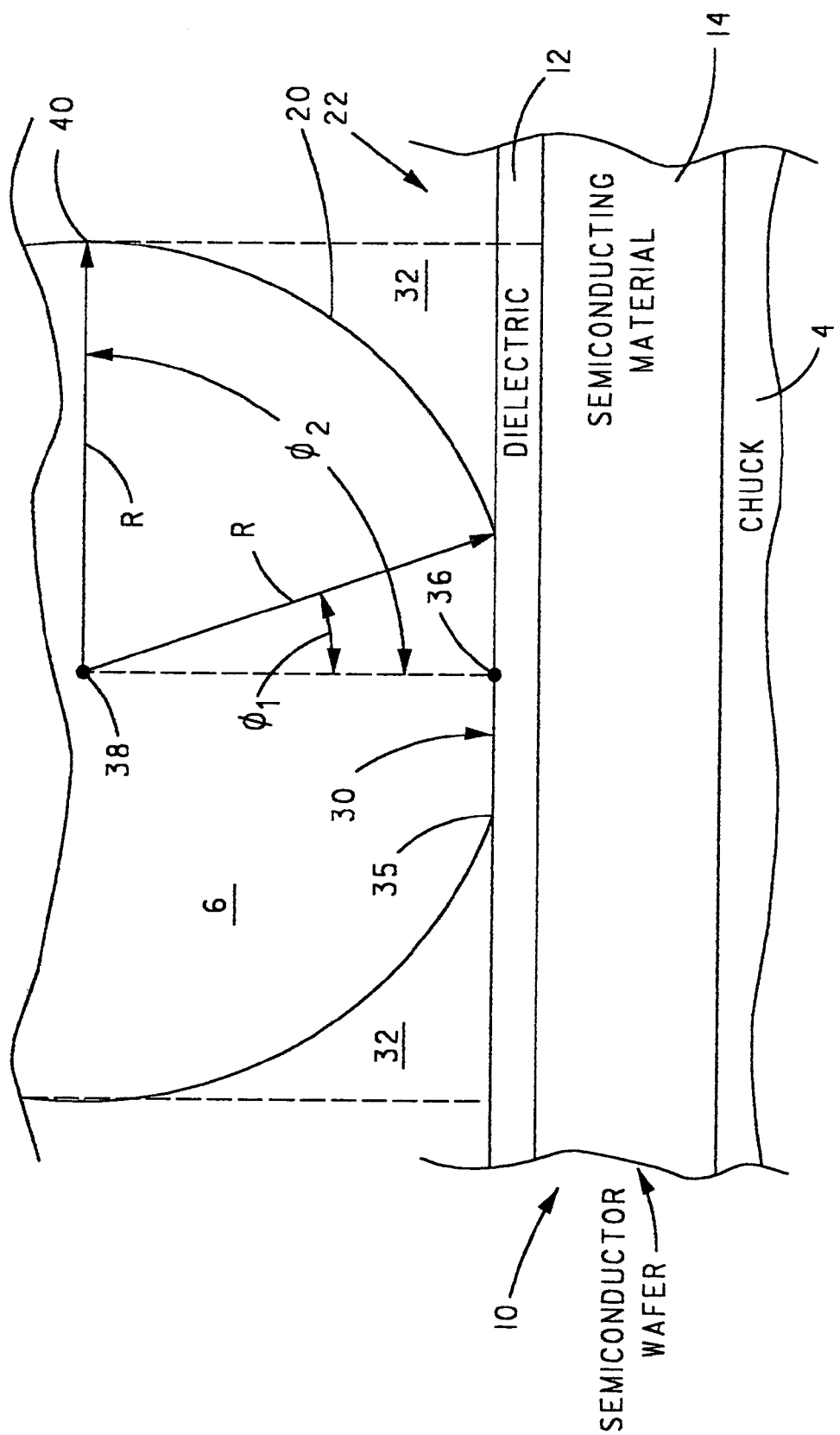
FIG. 4 is a view of the distal end of the contact means in contact with the topside of semiconductor wafer shown in FIG. 1 in the absence of water and organics on the surface of the dielectric layer.

With reference to FIG. 4 and with continuing reference to all previous figures, in practice it is desirable to eliminate the effect of organic(s) 16 and/or water 18 oil the determination of the permittivity of dielectric layer 12 since determining the thickness of organic(s) 16 and/or water 18 can be difficult and inaccurate. To this end, any delay between determining the thickness of organic(s) 16 and/or water 18 and determining capacitance $C_T$ of capacitor C may result in one or both of said thicknesses changing whereupon the determination of capacitance $C_T$ is affected. Accordingly, prior to surface 20 of contact means 6 moving into contact with topside 22 of semiconductor wafer 10, organic(s) 16 and/or water 18 are desirably desorbed from semiconductor wafer 10 in a manner known in the art, e.g. heating semiconductor wafer 10 to an elevated temperature. After desorbing organic(s) 16 and/or water 18, surface 20 and topside 22, in this case the topside of dielectric layer 12, can be moved directly into contact.

Desirably, surface 20 of contact means 6 does not include an oxide layer. However, if surface 20 includes an oxide layer (not shown), such oxide layer is desirably conductive. Suitable materials for surface 20 include platinum and iridium. However, this is not to be considered as limiting the invention since surface 20 can be formed from any suitable material that either does not form an oxide layer or forms a conductive oxide layer.

If capacitance $C_T$ of capacitor C is determined after organic(s) 16 and/or water 18 are desorbed from semiconductor wafer 10, and contact means 6 does not include an oxide layer on surface 20, equation EQ4 can be reduced to the form shown in the following equation EQ5:

$$\text{EQ5:} \quad C_3 = 2\pi\varepsilon_0 \varepsilon R \ln\left[\frac{(T_{ox}/\varepsilon_{ox}) + (T_{gap})}{(T_{ox}/\varepsilon_{ox})}\right]$$

If the radius R of curvature of surface 20 is large and the diameter of perimeter 34 is also large, the operation ($T_{ox}/\varepsilon_{ox}$) in the numerator of equation EQ5 can be ignored.

As can be seen, in order to determine capacitance $C_3$ in equations EQ4 and EQ5, the thickness of dielectric layer 12 ($T_{ox}$) is required. $T_{ox}$ can be determined in any manner known in the art, such as ellipsometry. Once a value has been determined for $T_{ox}$, this value can be provided to measurement means 28 for calculation of the permittivity $\varepsilon_{ox}$ of dielectric layer 12.

In equations EQ3 and EQ4, the radius R of curvature of surface 20 is utilized in addition to the thickness and permittivity of dielectric layer 12, organic(s) 16, water 18 and any oxide on contact means 6. More specifically, in equations EQ3 and EQ4, the radius R of curvature of surface 20 is directly proportioned to capacitance $C_2$ or $C_3$, as the case may be. Hence, the larger the radius R, the larger the value of capacitance $C_T$ of capacitor C. It has been determined that surface 20 having a radius R>12.5 mm (diameter>25 mm), that is about one order of magnitude greater than the diameter of the distal end of a prior art conductive elastic probe, yields a value of capacitor $C_T$ that can be measured readily.

In equations EQ4 and EQ5, the thickness of gap 32 $T_{gap}$ is utilized to determine capacitance $C_3$ of capacitor C3. The thickness of gap 32 $T_{gap}$ in equations EQ4 and EQ5 is the average thickness of gap 32. More specifically, with specific reference to FIG. 3, the thickness of gap 32 $T_{gap}$ used in equations EQ4 and EQ5 can be determined utilizing the following equation EQ6:

$$T_{gap} = R(\cos\theta_2 - \cos\theta_3) \quad \text{EQ6}$$

where R=radius of curvature of surface 20;
   $\theta_2$=an angle between a center 36 of contact area 30 and a perimeter 34 of contact area 31 measured with respect to a center 38 of radius R; and
   $\theta_3$=an angle, measured with respect to center 38 of radius R, between center 36 of contact area 30 and a perimeter 40 of surface 20 where surface 20 is no longer in opposition with topside 22 of semiconductor wafer 10.

In FIG. 3, topside 22 includes the surface of organic(s) 16 forming contact area 30, the surface of water 18 forming contact area 31 and the surface of water 18 in alignment with gap 32. Prior to moving surface 20 into contact with topside 22, however, the top surface of water 18 defines topside 22 as shown in FIG. 2. Hence, as can be seen, the material(s) comprising topside 22 can vary depending upon whether surface 20 is in contact therewith.

If water 18 is present, the thickness of water 18 $T_{H_2O}$ in equation EQ4 is the average thickness of water 18 in alignment with contact area 31. More specifically, with specific reference to FIG. 3, the thickness of water 18 $T_{H_2O}$ used in equation EQ3 can be determined utilizing the following equation EQ7:

$$T_{H_2O} = R(\cos\theta_1 - \cos\theta_2) \quad \text{EQ7}$$

where R=radius of curvature of surface 20;
   $\theta_1$=an angle between center 36 and a perimeter 35 of contact area 30 measured with respect to center 38 of radius R; and
   $\theta_2$=an angle, measured with respect to center 38 of radius R, between center 36 and the perimeter 34 of contact area 31.

With specific reference to FIG. 4, if topside 22 has been desorbed of water 18 and/or organic(s) 16, the thickness of gap 32 $T_{gap}$ used in equation EQ4 can be determined utilizing the following equation EQ8:

$$T_{gap} = R(\cos\theta_1 - \cos\theta_2) \quad \text{EQ8}$$

where R=radius of curvature of surface 20;
   $\theta_1$=an angle between center 36 and perimeter 35 of contact area 30 measured with respect to center 38 of radius R; and
   $\theta_2$=an angle, measured with respect to center 38 of radius R, between center 36 and perimeter 40 of surface 20 where surface 20 is no longer in opposition with topside 22 of semiconductor wafer 10.

As can be seen, the present invention enables the permittivity of a dielectric layer on a semiconductor wafer to be determined to an acceptable tolerance as a function of the thickness of dielectric layer 12 and the measured capacitance $C_T$ of capacitor C. The present invention is especially useful for determining the permittivity of relatively thick dielectric layers having relatively low permittivities.

The present invention has been described with reference to the preferred embodiment. Obvious modifications and alterations will occur to others upon reading and understanding the preceding detailed description. It is intended that the present invention be construed as including all such modifications and alterations insofar as they come within the scope of the appended claims or the equivalents thereof.

The invention claimed is:

1. A method of determining a permittivity of a dielectric layer of a semiconductor wafer comprising:
   (a) providing a means for contacting a topside of a semiconductor wafer, the contact means including at least a partially spherical surface formed from a conductive material;
   (b) determining a thickness of a dielectric layer on the semiconductor wafer having semiconducting material underlying the dielectric layer;
   (c) causing the at least partially spherical surface of the contact means to contact the topside of the semiconductor wafer thereby defining a capacitor, wherein the capacitance of the capacitor is comprised of a first capacitance resulting from materials in alignment with a contact area of the contact means in contact with the top surface of the semiconductor wafer and a second capacitance resulting from materials in alignment with a gap defined between the top surface of the semiconductor wafer and a surface of the contact means not in contact with the top surface surrounding the contact area;
   (d) applying an electrical stimulus to the contact means and the semiconducting material when the capacitor is defined;
   (e) determining the capacitance of the capacitor from the response thereof to the applied electrical stimulus; and
   (f) determining a permittivity of the dielectric layer as a function of the capacitance determined in step (e), the thickness of the dielectric layer determined in step (b) and the thickness of the gap surrounding the contact area.

2. The method of claim 1, wherein the topside of the semiconductor wafer comprises at least one of:
   a surface of the dielectric layer opposite the semiconducting material; and
   a surface of organic(s) and/or water overlaying the surface of the dielectric layer opposite the semiconducting material.

3. The method of claim 2, wherein the permittivity of the dielectric layer ($\varepsilon_{ox}$) is determined utilizing the formula:

$$C = \varepsilon_0 A[(T_p/\varepsilon_p) + (T_{ox}/\varepsilon_{ox}) + (T_{org}/\varepsilon_{org})]^{-1} +$$
$$2\pi\varepsilon_0\varepsilon_{H_2O}R\ln\left[\frac{(T_p/\varepsilon_p) + (T_{ox}/\varepsilon_{ox}) + (T_{org}/\varepsilon_{org}) + (T_{H_2O}/\varepsilon_{H_2O})}{(T_p/\varepsilon_p) + (T_{ox}/\varepsilon_{ox}) + (T_{org}/\varepsilon_{org})}\right] +$$
$$2\pi\varepsilon_0 R\ln\left[\frac{(T_p/\varepsilon_p) + (T_{ox}/\varepsilon_{ox}) + (T_{org}/\varepsilon_{org}) + (T_{H_2O}/\varepsilon_{H_2O}) + (T_{gap})}{(T_p/\varepsilon_p) + (T_{ox}/\varepsilon_{ox}) + (T_{org}/\varepsilon_{org}) + (T_{H_2O}/\varepsilon_{H_2O})}\right]$$

where C=the capacitance determined in step (e);
   $\varepsilon_0$=permittivity of free space;
   A=contact area of the contact means in contact with the topside of the semiconductor wafer;

R=radius of curvature of the contact means;
ln=natural log;
$T_p$=thickness of an oxide layer (if any) on the surface of the contact means;
$\epsilon_p$=permittivity of the oxide layer;
$T_{ox}$=thickness of the dielectric layer;
$\epsilon_{ox}$=permittivity of the dielectric layer;
$T_{org}$=thickness of the organic(s) (if any) overlaying the dielectric layer;
$\epsilon_{org}$=permittivity of the organic(s);
$T_{H_2O}$=thickness of the water (if any) overlaying the dielectric layer;
$\epsilon_{H_2O}$=permittivity of the water; and
$T_{gap}$=thickness of the gap surrounding the contact area.

4. The method of claim 1, further including desorbing at least one of water and organic(s) from a surface of the dielectric layer.

5. The method of claim 1, wherein the at least partially spherical surface is formed from a conductive material that either does not form an oxide layer or forms a conductive oxide on the surface thereof.

6. A system for determining a permittivity of a dielectric layer of a semiconductor wafer comprising:
  means for contacting a topside of a semiconductor wafer, the contact means including at least a partially spherical surface formed from a conductive material;
  means for determining a thickness of a dielectric layer on the semiconductor wafer having semiconducting material underlying the dielectric layer;
  means for moving the topside of the semiconductor wafer and the at least partially spherical surface of the contact means into contact thereby defining with the dielectric layer a capacitor having a capacitance comprised of a first capacitance resulting from materials in alignment with a contact area of the contact means in contact with the top surface of the semiconductor wafer and a second capacitance resulting from materials in alignment with a gap defined between the top surface of the semiconductor wafer and a surface of the contact means not in contact with the top surface surrounding the contact area;
  means for applying an electrical stimulus to the contact means and the semiconducting material when the capacitor is defined; and
  means for determining a capacitance of the capacitor from the response of the capacitor to the applied electrical stimulus; and
  means for determining a permittivity of the dielectric layer as a function of the capacitance, the thickness of the dielectric layer and a thickness of the gap surrounding the contact area.

7. The system of claim 6, wherein the topside of the semiconductor wafer comprises at least one of:
  a surface of the dielectric layer opposite the semiconducting material; and
  a surface of organic(s) and/or water overlaying the surface of the dielectric layer opposite the semiconducting material.

8. The system of claim 6, further including means for desorbing at least one of water and organic(s) from a surface of the dielectric layer.

9. The apparatus of claim 6, wherein the at least partially spherical surface is formed from a conductive material that either does not form an oxide layer or forms a conductive oxide on the surface thereof.

10. The system of claim 6, wherein the means for determining the permittivity of the dielectric layer utilizes the formula:

$$C = \epsilon_0 A[(T_p/\epsilon_p) + (T_{ox}/\epsilon_{ox}) + (T_{org}/\epsilon_{org})]^{-1} +$$
$$2\pi\epsilon_0\epsilon_{H_2O} R\ln\left[\frac{(T_p/\epsilon_p) + (T_{ox}/\epsilon_{ox}) + (T_{org}/\epsilon_{org}) + (T_{H_2O}/\epsilon_{H_2O})}{(T_p/\epsilon_p) + (T_{ox}/\epsilon_{ox}) + (T_{org}/\epsilon_{org})}\right] +$$
$$2\pi\epsilon_0 R\ln\left[\frac{(T_p/\epsilon_p) + (T_{ox}/\epsilon_{ox}) + (T_{org}/\epsilon_{org}) + (T_{H_2O}/\epsilon_{H_2O}) + (T_{gap})}{(T_p/\epsilon_p) + (T_{ox}/\epsilon_{ox}) + (T_{org}/\epsilon_{org}) + (T_{H_2O}/\epsilon_{H_2O})}\right]$$

where C=the capacitance determined in step (e);
$\epsilon_0$=permittivity of free space;
A=contact area of the contact means in contact with the topside of the semiconductor wafer;
R=radius of curvature of the contact means;
ln=natural log;
$T_p$=thickness of an oxide layer (if any) on the surface of the contact means;
$\epsilon_p$=permittivity of the oxide layer;
$T_{ox}$=thickness of the dielectric layer;
$\epsilon_{ox}$=permittivity of the dielectric layer;
$T_{org}$=thickness of the organic(s) (if any) overlaying the dielectric layer;
$\epsilon_{org}$=permittivity of the organic(s);
$T_{H_2O}$=thickness of the water (if any) overlaying the dielectric layer;
$\epsilon_{H_2O}$=permittivity of the water; and
$T_{gap}$=thickness of the gap surrounding the contact area.

11. A method of determining a permittivity of a dielectric layer of a semiconductor wafer comprising:
  (a) determining a thickness of the dielectric layer overlaying semiconducting material of a semiconductor wafer;
  (b) moving a topside of the semiconductor wafer and a spherical portion of an at least partially spherical and electrically conductive surface into contact;
  (c) applying an electrical stimulus between the electrically conductive surface and the semiconducting material;
  (d) determining from the applied electrical stimulus a capacitance of a capacitor comprised of a first capacitance resulting from materials in alignment with a contact area of the contact means in contact with the top surface of the semiconductor wafer and a second capacitance resulting from materials in alignment with a gap between the top surface and the contact means surrounding the contact area; and
  (e) determining a permittivity of the dielectric layer as a function of the capacitance determined in step (d), the thickness of the dielectric layer determined in step (a) and a thickness of the gap surrounding the contact area.

12. The method of claim 11, wherein the topside of the semiconductor wafer comprises at least one of:
  a surface of the dielectric layer opposite the semiconducting material; and
  a surface of organic(s) and/or water overlaying the surface of the dielectric layer opposite the semiconducting material.

13. The method of claim 11, further including, prior to step (b), desorbing at least one of water and organic(s) from a surface of the dielectric layer.

14. The method of claim 11, wherein the electrically conductive surface is formed from a material that either does not form an oxide layer thereon or forms a conductive oxide thereon.

15. The method of claim 11, wherein the permittivity of the dielectric layer ($\in_{ox}$) is determined by solving the following formula for $\in_{ox}$:

$$C = \varepsilon_0 A[(T_p/\varepsilon_p) + (T_{ox}/\varepsilon_{ox}) + (T_{org}/\varepsilon_{org})]^{-1} +$$

$$2\pi\varepsilon_0\varepsilon_{H_2O} R\ln\left[\frac{(T_p/\varepsilon_p) + (T_{ox}/\varepsilon_{ox}) + (T_{org}/\varepsilon_{org}) + (T_{H_2O}/\varepsilon_{H_2O})}{(T_p/\varepsilon_p) + (T_{ox}/\varepsilon_{ox}) + (T_{org}/\varepsilon_{org})}\right] +$$

$$2\pi\varepsilon_0 R\ln\left[\frac{(T_p/\varepsilon_p) + (T_{ox}/\varepsilon_{ox}) + (T_{org}/\varepsilon_{org}) + (T_{H_2O}/\varepsilon_{H_2O}) + (T_{gap})}{(T_p/\varepsilon_p) + (T_{ox}/\varepsilon_{ox}) + (T_{org}/\varepsilon_{org}) + (T_{H_2O}/\varepsilon_{H_2O})}\right]$$

where C=the capacitance determined in step (e);
$\in_0$=permittivity of free space;
A=contact area of the contact means in contact with the topside of the semiconductor wafer;
R=radius of curvature of the contact means;
ln=natural log;
$T_p$=thickness of an oxide layer (if any) on the surface of the contact means;
$\in_p$=permittivity of the oxide layer;
$T_{ox}$=thickness of the dielectric layer;
$\in_{ox}$=permittivity of the dielectric layer;
$T_{org}$=thickness of the organic(s) (if any) overlaying the dielectric layer;
$\in_{org}$=permittivity of the organic(s);
$T_{H_2O}$=thickness of the water (if any) overlaying the dielectric layer;
$\in_{H_2O}$=permittivity of the water; and
$T_{gap}$=thickness of the gap surrounding the contact area.

* * * * *